(12) United States Patent
Park et al.

(10) Patent No.: US 12,161,042 B2
(45) Date of Patent: Dec. 3, 2024

(54) FOLDABLE DISPLAY DEVICE

(71) Applicant: LG Display Co., Ltd., Seoul (KR)

(72) Inventors: Sungjin Park, Seoul (KR); Gyuho Lee, Seoul (KR); Sinchul Kang, Gimpo-si (KR); Miyeon Seo, Namyangju-si (KR); Suk Choi, Hwaseong-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/364,798

(22) Filed: Aug. 3, 2023

(65) Prior Publication Data

US 2024/0188413 A1   Jun. 6, 2024

(30) Foreign Application Priority Data

Dec. 1, 2022 (KR) .................. 10-2022-0165539

(51) Int. Cl.
   *G09G 3/20*     (2006.01)
   *G09F 9/30*     (2006.01)
   *H10K 77/10*    (2023.01)
   *H10K 102/00*   (2023.01)

(52) U.S. Cl.
   CPC ............ *H10K 77/111* (2023.02); *G09F 9/301* (2013.01); *H10K 2102/311* (2023.02)

(58) Field of Classification Search
   CPC ..... G09F 9/301; G06F 1/1616; H10K 77/111; H10K 2102/311
   See application file for complete search history.

(56) References Cited

U.S. PATENT DOCUMENTS

| | | | |
|---|---|---|---|
| 9,983,424 B2* | 5/2018 | Kim | H10K 77/111 |
| 10,755,991 B2* | 8/2020 | Park | B32B 15/09 |
| 10,930,883 B2* | 2/2021 | Park | H10K 50/8426 |
| 11,246,228 B2 | 2/2022 | Kim et al. | |
| 2015/0043174 A1* | 2/2015 | Han | G02F 1/13452 |
| | | | 428/156 |
| 2018/0150108 A1* | 5/2018 | Song | H10K 59/40 |
| 2019/0196548 A1* | 6/2019 | Kim | G06F 1/1681 |
| 2019/0207141 A1* | 7/2019 | Kim | H05K 5/0017 |
| 2020/0319672 A1* | 10/2020 | Kim | G06F 1/1656 |
| 2021/0066626 A1* | 3/2021 | Park | G06F 1/1652 |
| 2021/0068276 A1 | 3/2021 | Kim et al. | |

(Continued)

FOREIGN PATENT DOCUMENTS

KR      20190081335 A  *  7/2019
KR      10-2021-0028463 A    3/2021

*Primary Examiner* — Joe H Cheng
(74) *Attorney, Agent, or Firm* — Fenwick & West LLP

(57) ABSTRACT

A foldable display device includes a display panel including a folding area and non-folding areas on both sides of the folding area in a folding direction; a first support substrate configured to support the display panel under the display panel and including a plurality of opening patterns corresponding to the folding area; and a second support substrate between the display panel and the first support substrate and including a plurality of protrusion patterns protruding to be inserted into the plurality of opening patterns. Sizes of the plurality of protrusion patterns are smaller than sizes of the corresponding plurality of opening patterns. Therefore, it is possible to improve durability and prevent or at least reduce degradation of folding characteristics of the foldable display device.

15 Claims, 10 Drawing Sheets

(56) References Cited

U.S. PATENT DOCUMENTS

| | | | |
|---|---|---|---|
| 2023/0161377 A1* | 5/2023 | Lee ...................... | G06F 1/1616 |
| | | | 361/679.01 |
| 2023/0221759 A1* | 7/2023 | Kim ..................... | G06F 1/1643 |
| | | | 361/679.01 |
| 2024/0188233 A1* | 6/2024 | Jang ........................ | H05K 5/02 |

* cited by examiner

FOLDABLE DISPLAY DEVICE

CROSS-REFERENCE TO RELATED APPLICATION

This application claims the benefit of and priority to Republic of Korea Patent Application No. 10-2022-0165539 filed on Dec. 1, 2022, in the Republic of Korea, the contents of which are hereby incorporated by reference in their entirety.

BACKGROUND

Technical Field

The present disclosure relates to a foldable display device, and more particularly, to a foldable display device having improved durability.

Discussion of the Related Art

Recently, as our society advances toward an information-oriented society, the field of display devices for visually expressing an electrical information signal has rapidly advanced. Various display devices having excellent performance in terms of thinness, lightness, and low power consumption, are being developed correspondingly. Specific examples of such display devices may include a liquid crystal display (LCD), a plasma display panel (PDP), a field emission display (FED), an organic light emitting display (OLED), and the like.

In recent years, a flexible display device that is manufactured to display an image even when it is bent or folded like paper has received attention as a next-generation display device. Flexible display devices may be classified into highly durable and unbreakable types, bendable types without breakage, rollable types, foldable types, and the like. Such flexible display devices can have advantages in terms of space utilization, interior and design aspects, and be used in various application fields. A display panel of the flexible display device uses a flexible substrate, and a support substrate such as a back plate is disposed under the display panel to prevent sagging of the display panel and to protect the display panel from external foreign substances and impacts.

SUMMARY

Some embodiments of the present disclosure are to provide a foldable display device capable of preventing or at least reducing opening patterns from being viewed in a folding area.

Some embodiments of the present disclosure are to provide a foldable display device capable of preventing or at least reducing pressing and sagging of a display panel due to opening patterns in a folding area.

Objects of the present disclosure are not limited to the above-mentioned objects, and other objects, which are not mentioned above, can be clearly understood by those skilled in the art from the following descriptions.

A foldable display device according to an exemplary embodiment of the present disclosure includes a display panel including a folding area and non-folding areas on both sides of the folding area in a folding direction: a first support substrate configured to support the display panel under the display panel and including a plurality of opening patterns corresponding to the folding area: and a second support substrate disposed between the display panel and the first support substrate and including a plurality of protrusion patterns protruding to be inserted into the plurality of opening patterns, wherein sizes of the plurality of protrusion patterns are smaller than sizes of the plurality of opening patterns.

Other detailed matters of the exemplary embodiments are included in the detailed description and the drawings.

According to the present disclosure, durability can be improved by inserting protrusion patterns into opening patterns in a folding area.

According to the present disclosure, it is possible to prevent or at least reduce degradation of folding characteristics even when protrusion patterns are inserted into opening patterns in a folding area.

The effects according to the present disclosure are not limited to the contents exemplified above, and more various effects are included in the present specification.

DETAILED DESCRIPTION

Figure 1:
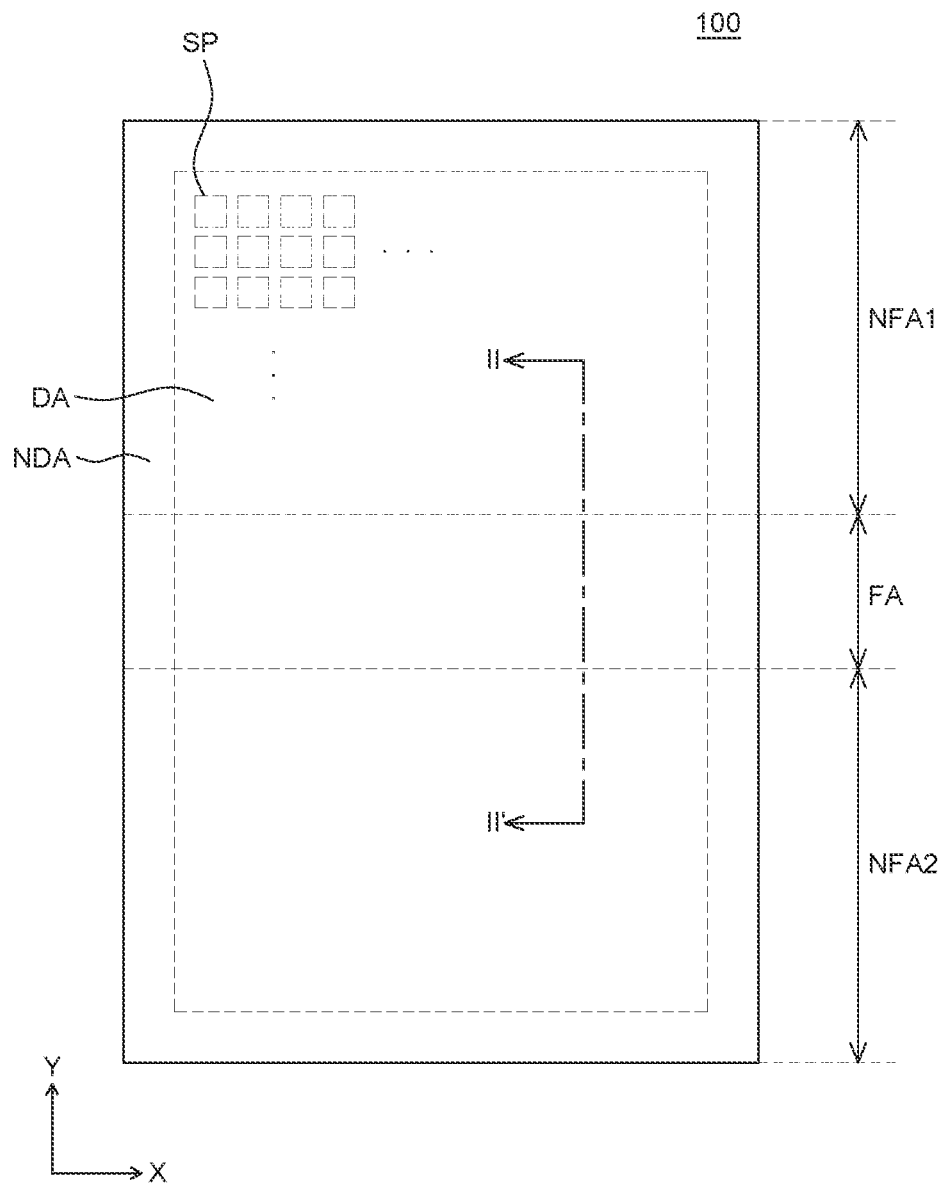
FIG. 1 is a plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings.

Figure 2:
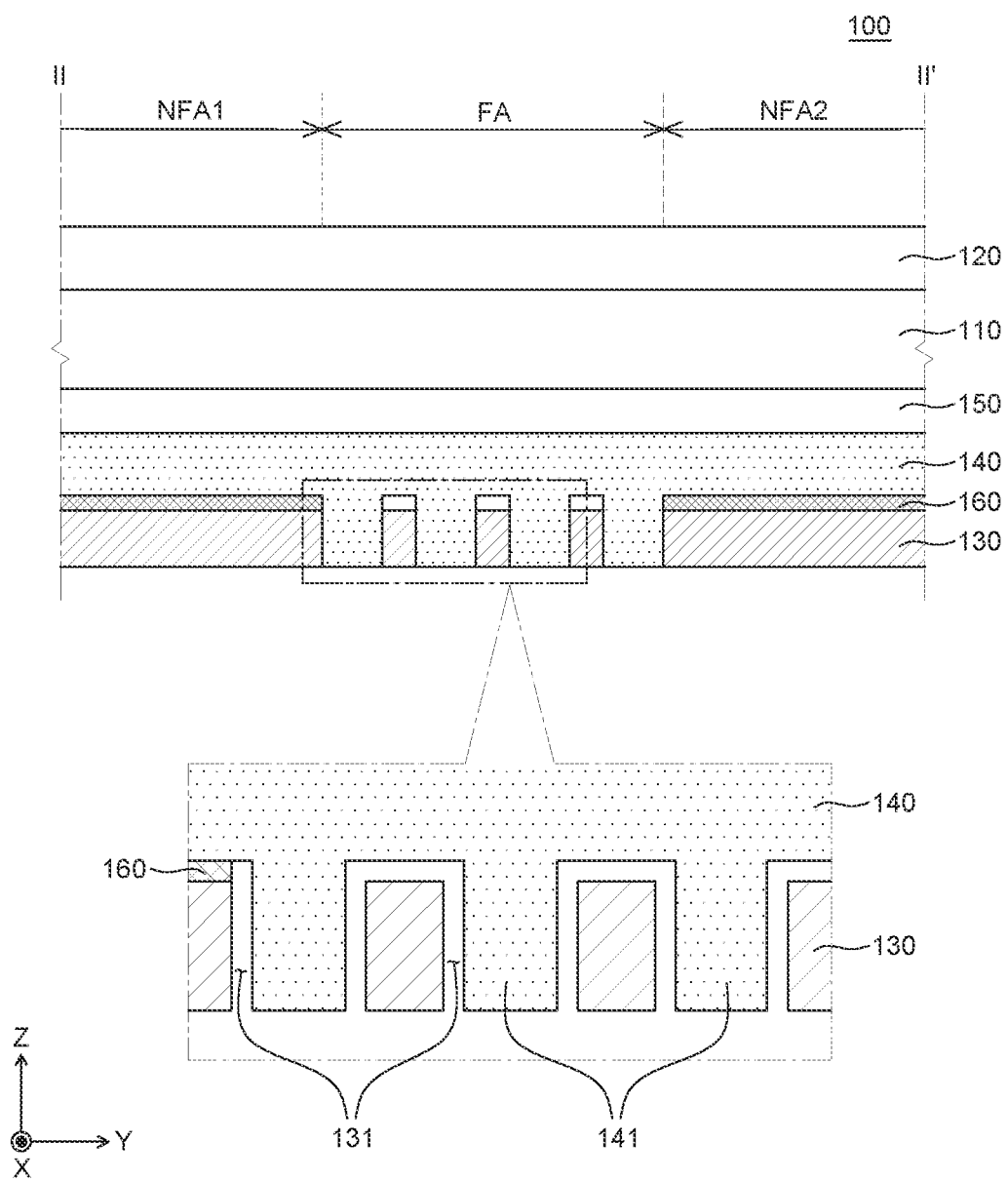
FIG. 2 is a cross-sectional view of II-II' of FIG. 1 according to an exemplary embodiment of the present disclosure.

FIG. 1 is a plan view of a display device according to an exemplary embodiment of the present disclosure. FIG. 2 is a cross-sectional view of II-II' of FIG. 1 according to an exemplary embodiment of the present disclosure.

Referring to FIGS. 1 and 2, a display device 100 according to an exemplary embodiment of the present disclosure includes a display panel 110, a cover window 120, a first support substrate 130, a second support substrate 140, and a back plate 150. Hereinafter, for convenience of description, the following description is made assuming that the display device 100 according to an exemplary embodiment of the present disclosure is an organic light emitting display device, but the present disclosure is not limited thereto.

The display panel 110 includes a display area DA and a non-display area NDA. Also, the display panel 110 includes a folding area FA and non-folding areas NFA1 and NFA2. The display panel 110 may be divided into a display area DA and a non-display area NDA depending on whether or not an image is displayed thereon. Also, the display panel 110 may be divided into a folding area FA and non-folding areas NFA1 and NFA2 depending on whether it is folded or not. Accordingly, a partial area of the display panel 110 may be both the display area DA and the folding area FA, and other partial areas of display panel 110 may be both the non-display area NDA and the non-folding area NFA1 and NFA2.

Meanwhile, hereinafter, for convenience of description, the following description is made assuming that the display device 100 according to an exemplary embodiment of the present disclosure is a foldable display device in which the folding area FA is disposed only in a portion of the display area DA. However, the display device 100 according to an exemplary embodiment of the present disclosure may be a flexible or rollable display device in which an entirety of the display area DA of the display panel 110 is the folding area FA, but the present disclosure is not limited thereto.

The display area DA is an area where a plurality of pixels are disposed to substantially display an image. In the display area DA, the plurality of pixels including emission areas for displaying images, and thin film transistors, capacitors and the like for driving the pixels may be disposed. One pixel may include a plurality of sub-pixels SP. The sub-pixels SP are minimum units constituting the display area, and each of the sub-pixels SP may be configured to emit light of a specific wavelength band. For example, each sub-pixel SP may be configured to emit red, green, blue or white light.

The non-display area NDA is disposed to surround the display area DA. The non-display area NDA is an area in which images are not substantially displayed, and various lines, driver ICs, and the like for driving the pixels and driving elements are disposed in the non-display area NDA.

As described above, the display panel 110 may be defined by the folding area FA and the non-folding areas NFA1 and NFA2 depending on whether or not it is folded. The display panel 110 includes one folding area FA and non-folding areas NFA1 and NFA2 excluding the folding area FA. The folding area FA is an area that is folded when the display device 100 is folded, and may be folded according to a specific radius of curvature based on a folding axis. Here, the folding axis may be formed in an X-axis direction. The non-folding areas NFA1 and NFA2 may be located on both sides of the folding area FA in a folding direction. Here, the folding direction may mean a direction of a Y-axis (a Y-axis direction) perpendicular to the folding axis (X-axis). When the folding area FA is folded with respect to the folding axis, the folding area FA may form a part of a circle or an ellipse. In this case, a radius of curvature of the folding area FA means a radius of a circle or an ellipse formed by the folding area FA.

The non-folding areas NFA1 and NFA2 are areas that are not folded when the display device 100 is folded. That is, the non-folding areas NFA1 and NFA2 maintain a flat state when the display device 100 is folded. The non-folding areas NFA1 and NFA2 may extend from both sides of the folding area FA along the folding direction. In this case, the folding area FA may be defined between the non-folding areas NFA1 and NFA2. The non-folding areas NFA1 and NFA2 include a first non-folding area NFA1 and a second non-folding area NFA2. The first non-folding area NFA1 may extend from one side of the folding area FA, and the second non-folding area NFA2 may extend from the other side of the folding area FA. When the display device 100 is folded with respect to the folding axis, the first non-folding area NFA1 and the second non-folding area NFA2 may overlap each other.

The display panel 110 includes a flexible substrate, a driving thin film transistor, a display element, and the like. The display panel 110 may be formed by encapsulating the flexible substrate on which the driving thin film transistor and the display element are formed by an encapsulation unit.

The display panel 110 includes the flexible substrate having a very small thickness and the display element disposed on the flexible substrate to implement flexibility.

The flexible substrate supports various elements constituting the display panel 110. The flexible substrate may be formed of an insulating material having a very small thickness in order to implement flexibility. For example, the flexible substrate may be an insulating plastic substrate selected from among polyimide, polyethersulfone, polyethylene terephthalate, and polycarbonate, but the present disclosure is not limited thereto.

The driving thin film transistor for driving the display element may be disposed on the flexible substrate. The driving thin film transistor may be disposed in each of the plurality of pixels. For example, the driving thin film transistor includes a gate electrode, an active layer, a source electrode, and a drain electrode. In addition, the driving thin film transistor may further include a gate insulating layer to insulate the gate electrode from the active layer, and may further include an interlayer insulating layer to insulate the gate electrode from the source electrode and the drain electrode.

The display element may be an organic light emitting element. The organic light emitting element may include an anode, a cathode, and an organic light emitting layer disposed therebetween. In the organic light emitting element, holes that are injected from the anode and electrons that are injected from the cathode combine with each other in the organic light emitting layer to emit light. An image may be displayed using the emitted light.

The cover window 120 is disposed on the display panel 110. The cover window 120 protects the display panel 110 from external impacts and scratches. Accordingly, the cover window 120 may be formed of a material that is transparent and has excellent impact resistance and scratch resistance properties. In addition, the cover window 120 protects the display panel 110 from moisture or the like that penetrates from the outside. Accordingly, the cover window 120 may prevent or at least reduce degradation of display quality due to deterioration of the display panel 110.

The cover window 120 may be implemented as a foldable soft plastic-based cover for thinness and flexibility of the display device 100. For example, the cover window 120 may be a film formed of a polymer such as polyimide, polyamide imide, polyethylene terephthalate, polymethyl methacrylate, polypropylene glycol, or polycarbonate. Alternatively, the cover window 120 may be a film formed of an optically isotropic polymer such as cycloolefin (co)polymer, optically isotropic polycarbonate, or optically isotropic polymethyl methacrylate.

The cover window 120 may have a multilayer structure in which various functional layers are stacked. For example, the cover window 120 may include various functional layers such as an external light reflection reduction layer, a UV blocking layer, and a hard coating layer. In addition, a touch panel constituting a touch sensor may be selectively disposed between the display panel 110 and the cover window 120 if necessary.

Meanwhile, the flexible substrate of the display panel 110 has excellent folding characteristics, but is thin and has low rigidity compared to a glass substrate or a metal substrate. Accordingly, it may be difficult to maintain a constant shape of the flexible substrate when it is folded, and sagging of the flexible substrate may occur due to various elements formed thereon. Accordingly, the first support substrate 130, the second support substrate 140, and the back plate 150 are disposed under the display panel 110 to support the flexible substrate and improve impact resistance. The first support substrate 130, the second support substrate 140, and the back plate 150 support the display panel 110 under the display panel 110, and may prevent or at least reduce sagging or deformation thereof and protect the display panel 110 from external impacts or foreign materials.

The first support substrate 130 may be referred to as a bottom plate. The first support substrate 130 may include a plurality of opening patterns 131 formed to correspond to the folding area FA of the display device 100. The display device 100 can be folded or unfolded through an increase in an elastic deformation section by the plurality of opening patterns 131 formed in the folding area FA.

The first support substrate 130 may be formed of stainless steel (SUS), iron (Fe) or aluminum (Al)-based materials containing metals such as stainless steel (SUS), nickel (Ni), and the like, or may be formed of a metal material such as magnesium (Mg). Preferably, stainless steel (SUS) may be applied as the first support substrate 130. For example, since stainless steel (SUS) has high restoring force and rigidity, the first support substrate 130 can maintain high rigidity even when a thickness of the first support substrate 130 decreases. Accordingly, the first support substrate 130 may support the display panel 110 simultaneously with reducing an overall thickness of the display device 100, so that the radius of curvature of the folding area FA can be reduced. However, the first support substrate 130 is not limited thereto, and may be formed of a polymer such as polymethylmethacrylate (PMMA), polycarbonate (PC), polyvinylalcohol (PVA), acrylonitrile-butadiene-styrene (ABS), polyethylene terephthalate (PET), silicone, or polyurethane (PU).

The second support substrate 140 may be referred to as a top plate. The second support substrate 140 may include a plurality of protrusion patterns 141 formed to correspond to the folding area FA of the display device 100. The plurality of protrusion patterns 141 correspond to the plurality of opening patterns 131 and may be inserted into the plurality of opening patterns 131. The plurality of protrusion patterns 141 may be formed to protrude toward the first support substrate 130 from the second support substrate 140. The plurality of protrusion patterns 141 may prevent degradation of durability due to the plurality of opening patterns 131. The second support substrate 140 may reinforce rigidity of the display panel 110 and prevent or at least reduce a phenomenon in which the plurality of opening patterns 131 formed in the first support substrate 130 may be seen through the display panel 110.

Meanwhile, in the drawings, the second support substrate 140 is illustrated as having a thickness similar to that of the first support substrate 130, but the present disclosure is not limited thereto. That is, the second support substrate 140 may have a thickness smaller than that of the first support substrate 130. In addition, the second support substrate 140 may be formed of a metal, elastomer, or the same material as the first support substrate 130, but the present disclosure is not limited thereto.

The first support substrate 130 and the second support substrate 140 may be attached by an adhesive layer 160. The adhesive layer 160 is disposed on the non-folding areas NFA1 and NFA2 and may not be disposed on the folding area FA. Therefore, it is possible to prevent or at least mitigate a decrease in durability due to a transfer of stress from the plurality of opening patterns 131 to the adhesive layer 160 during a folding operation. The adhesive layer 160 may be formed of a transparent adhesive material such as optical clear resin (OCR) or optical clear adhesive (OCA), but the present disclosure is not limited thereto. In addition, although not illustrated, the adhesive layer may also be disposed between the second support substrate 140 and the back plate 150, between the back plate 150 and the display panel 110, and between the display panel 110 and the cover window 120.

The back plate 150 may be disposed between the display panel 110 and the second support substrate 140. The back plate 150 may be further attached to a rear surface of the display panel 110 to further support the display panel 110 in a thin form, but can be excluded if necessary. The back plate 150 may prevent or at least reduce a phenomenon in which a display screen is transferred or distorted due to the plurality of opening patterns 131 provided in the first support substrate 130.

The back plate 150 may be formed of a polymer such as polyimide (PI), polymethylmethacrylate (PMMA), polycarbonate (PC), polyvinylalcohol (PVA), acrylonitrile-butadiene-styrene (ABS), polyethylene terephthalate (PET), silicone, or polyurethane (PU), but the present disclosure is not limited thereto.

Hereinafter, the folding area FA of the first support substrate 130 and the second support substrate 140 will be described in detail with reference to FIGS. 3 to 5.

Figure 3:
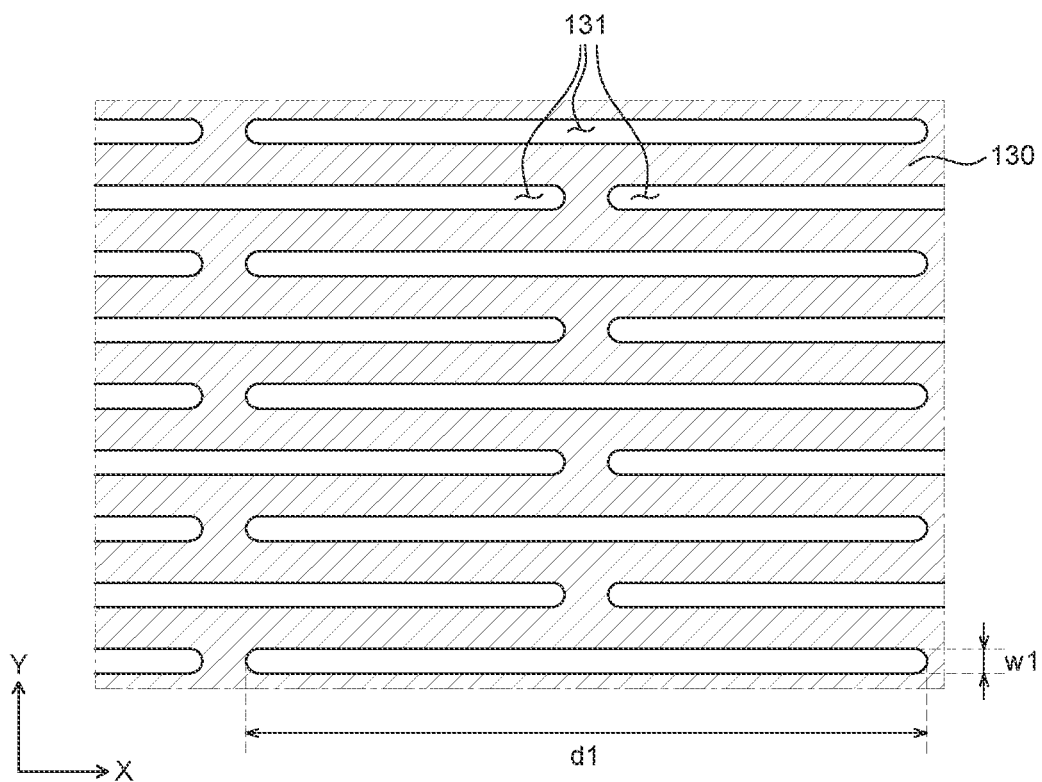
FIG. 3 is an enlarged plan view of a first support substrate according to an exemplary embodiment of the present disclosure.

FIG. 3 is an enlarged plan view of the first support substrate according to an exemplary embodiment of the present disclosure. FIG. 4 is an enlarged plan view of the second support substrate according to an exemplary embodiment of the present disclosure. FIG. 5 is an enlarged plan view illustrating coupling of the first support substrate and the second support substrate according to an exemplary embodiment of the present disclosure. FIGS. 3 to 5 are all enlarged plan views of portions of the folding area FA. In addition, FIGS. 3 to 5 illustrate the first support substrate 130 or the second support substrate 140 when viewed from a bottom surface thereof. Here, the bottom surface means a surface disposed on a bottom with reference to FIG. 2.

Figure 4:
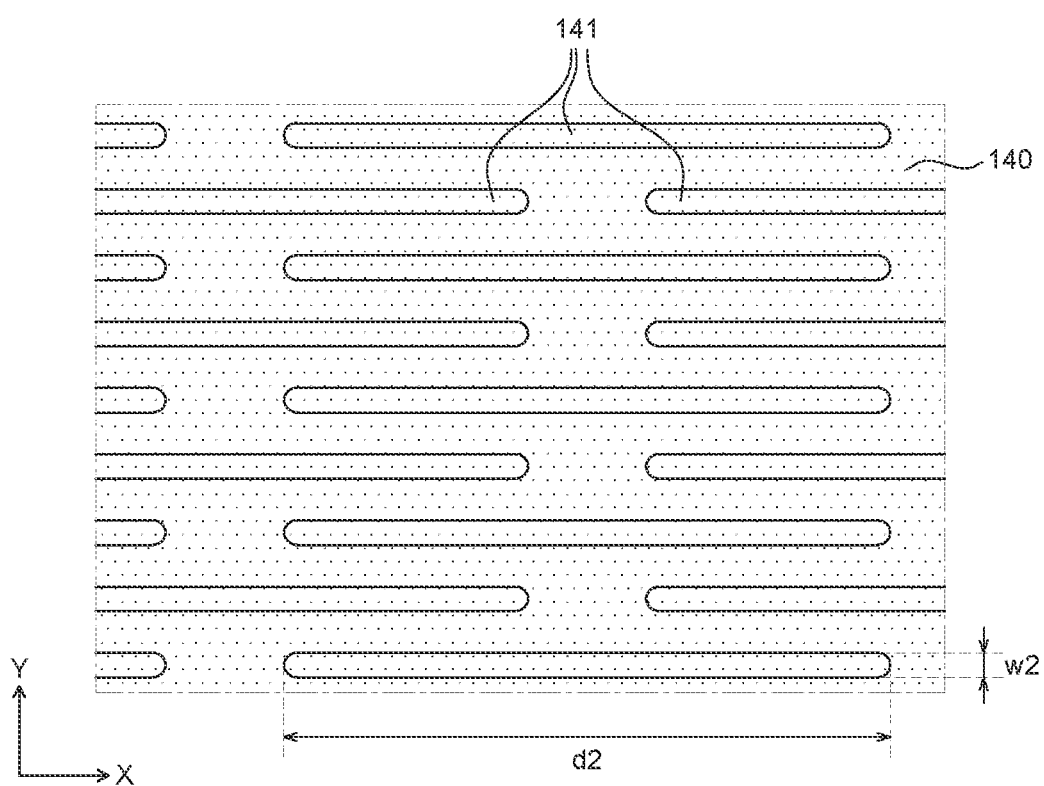
FIG. 4 is an enlarged plan view of a second support substrate according to an exemplary embodiment of the present disclosure.
Figure 5:
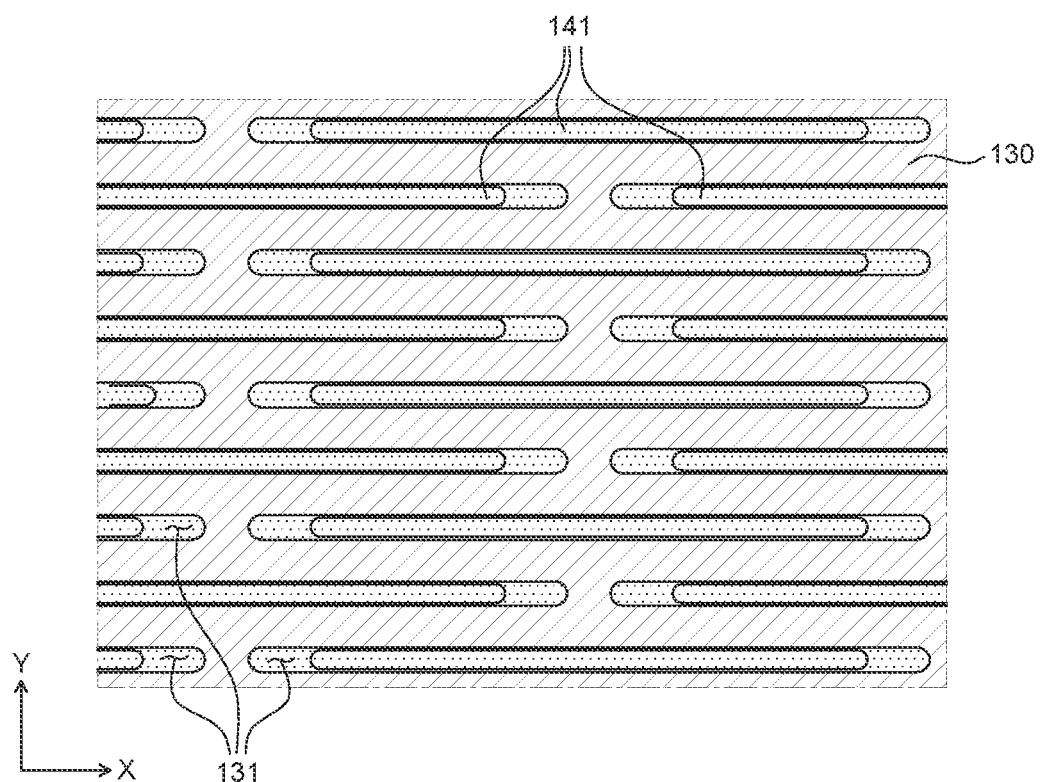
FIG. 5 is an enlarged plan view illustrating coupling of the first support substrate and the second support substrate according to an exemplary embodiment of the present disclosure.

Referring to FIGS. 3 to 5, the folding area FA of the first support substrate 130 includes the plurality of opening patterns 131, and the folding area FA of the second support substrate 140 includes the plurality of protrusion patterns 141. When the first support substrate 130 and the second support substrate 140 are coupled with each other, the plurality of protrusion patterns 141 may be inserted into the plurality of opening patterns 131.

The first support substrate 130 can be easily folded or unfolded in the folding area FA by the plurality of opening patterns 131. The first support substrate 130 may have high flexibility due to the plurality of opening patterns 131. Accordingly, folding characteristics of the display device 100 may be improved by the plurality of opening patterns 131. Also, the plurality of opening patterns 131 may be deformed as they contract or expand when the display device 100 is folded. Accordingly, it is possible to prevent or at least reduce cracks from occurring in the display panel 110 by dispersing stress generated during a folding operation.

The plurality of opening patterns 131 have a shape elongated in the X-axis direction, which is a direction perpendicular to the folding direction. That is, the plurality of opening patterns 131 have a shape in which a length d1 in the X-axis direction is greater than a width w1 in the Y-axis direction. Sizes of the plurality of opening patterns 131 may be identical to each other. Both ends of the plurality of opening patterns 131 may be formed to have curvature. In addition, the plurality of opening patterns 131 disposed in adjacent rows may be alternately disposed. However, the shapes of the plurality of opening patterns 131 are not limited to those illustrated in the drawings.

The plurality of protrusion patterns 141 may have a shape similar to that of the plurality of opening patterns 131. That is, the plurality of protrusion patterns 141 have a shape in which a length d2 in the X-axis direction is greater than a width w2 in the Y-axis direction. Sizes of the plurality of protrusion patterns 141 may be identical to each other. Both ends of the plurality of protrusion patterns 141 may be formed to have curvature. In addition, the plurality of protrusion patterns 141 disposed in adjacent rows may be alternately disposed. However, the shapes of the plurality of protrusion patterns 141 are not limited to those illustrated in the drawings.

The size of the plurality of protrusion patterns 141 may be smaller than that of the plurality of opening patterns 131. That is, the length d2 of the plurality of protrusion patterns 141 is smaller than the length d1 of the plurality of opening patterns 131. In addition, the width w2 of the plurality of protrusion patterns 141 is smaller than the width w1 of the plurality of opening patterns 131. Accordingly, the plurality of protrusion patterns 141 and the plurality of opening patterns 131 may be spaced apart from each other. Thus, the plurality of protrusion patterns 141 may be easily inserted into the plurality of opening patterns 131. Also, even when the display device 100 is folded, interference between the plurality of protrusion patterns 141 and the plurality of opening patterns 131 can be minimized or at least reduced, and degradation of folding characteristics can be prevented or at least reduced.

The width w2 of the plurality of protrusion patterns 141 may be in a range of 85% to 96.5% of the width w1 of the plurality of opening patterns 131. When the width w2 of the plurality of protrusion patterns 141 is smaller than 85% of the width w1 of the plurality of opening patterns 131, durability of the folding area FA is reduced, and the opening patterns 131 may be visible and noise may occur. When the width w2 of the plurality of protrusion patterns 141 is greater than 96.5% of the width w1 of the plurality of opening patterns 131, folding characteristics may be degraded. That is, as the plurality of opening patterns 131 are deformed during a folding operation, the plurality of protrusion patterns 141 come into contact with inner surfaces of the plurality of opening patterns 131, and friction therebetween may occur.

Meanwhile, when the folding area FA is folded, the amount of deformation in a length direction of the plurality of opening patterns 131 is relatively smaller than the amount of deformation in a width direction thereof. That is, during a folding operation, the amount of deformation of the plurality of opening patterns 131 in the X-axis direction is relatively smaller than the amount of deformation thereof in the Y-axis direction. Accordingly, the length d2 of the plurality of protrusion patterns 141 may be in a range of 90% to 99.9% of the length d1 of the plurality of opening patterns 131. When the length d2 of the plurality of protrusion patterns 141 is smaller than 90% of the length d1 of the plurality of opening patterns 131, durability of the folding area FA is reduced and the opening patterns 131 may be viewed and noise may occur. When the length d2 of the plurality of protrusion patterns 141 is greater than 99.9% of the length d1 of the plurality of opening patterns 131, folding characteristics may be degraded.

Meanwhile, in FIGS. 3 to 5, descriptions are made based on that the sizes of the plurality of opening patterns 131 are all the same and the sizes of the plurality of protrusion patterns 141 are all the same. However, in some embodiments, the sizes of the plurality of opening patterns 131 may be configured differently. In addition, in some embodiments, the sizes of the plurality of protrusion patterns 141 may be configured differently. This will be described later with reference to FIGS. 7 to 10.

Figure 6:
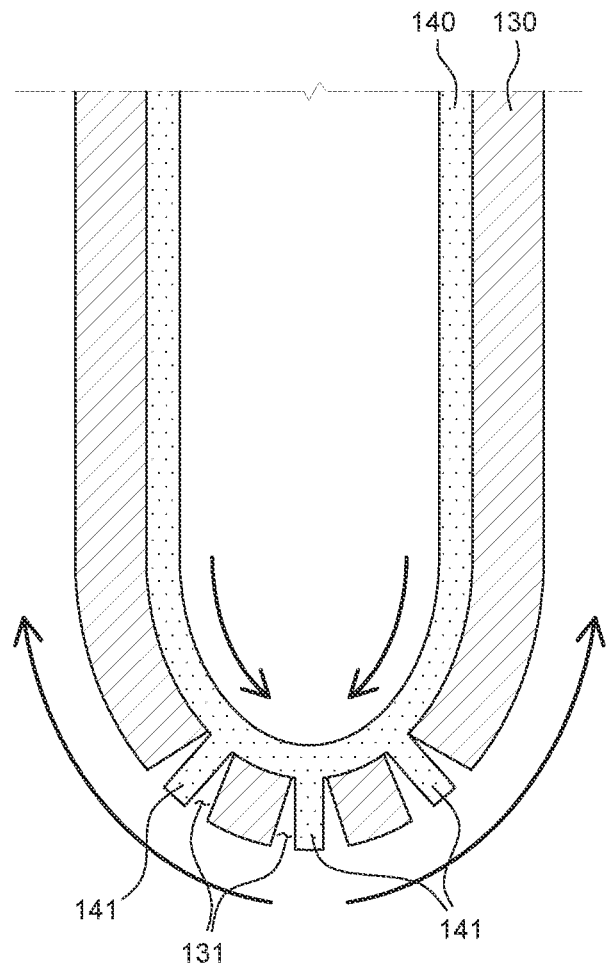
FIG. 6 is a cross-sectional view illustrating folding of the display device according to an exemplary embodiment of the present disclosure.

FIG. 6 is a cross-sectional view illustrating folding of the display device according to an exemplary embodiment of the present disclosure. In FIG. 6, only the first support substrate 130 and the second support substrate 140 are schematically illustrated for convenience of explanation.

Referring to FIG. 6, when the display device 100 is folded, the opening patterns 131 of the first support substrate 130 and the protrusion patterns 141 of the second support substrate 140 may not affect each other. Specifically, as indicated by arrows, an upper portion of each of the first support substrate 130 and the second support substrate 140 receives a force in a compressive direction during a folding operation. In addition, as illustrated by arrows, a lower portion of each of the first support substrate 130 and the second support substrate 140 receives a force in a tensile direction during a folding operation. Accordingly, a lower portion of the opening pattern 131 may be expanded along the tensile direction. In addition, a lower portion of the protrusion pattern 141 may move in a direction away from a lower portion of the protrusion pattern 141 adjacent thereto, along the tensile direction. That is, during a folding operation, a direction in which the opening pattern 131 is expanded and a direction in which the protrusion pattern 141 moves may be identical to each other. Accordingly, during a folding operation, the protrusion pattern 141 and the inner surface of the opening pattern 131 may be easily deformed without contacting each other. Therefore, even if the plurality of protrusion patterns 141 are inserted into the plurality of opening patterns 131, folding characteristics of the display device 100 are not affected, and at the same time, rigidity of the display device 100 can be secured.

In addition, since the protrusion pattern 141 and the inner surface of the opening pattern 131 do not come into contact with each other, the protrusion pattern 141 and the opening pattern 131 can be easily restored to their original states even during an unfolding operation. Accordingly, durability can be improved even if the display device 100 is repeatedly folded and unfolded.

In a general foldable display device, opening patterns are formed in a folding area of a bottom plate to improve folding characteristics. In this case, flexibility can be improved due to the opening patterns, but there may occur defects in which the opening pattern is visible and noise is generated in a folding portion or durability is deteriorated due to formation of the opening pattern. Specifically, since shear stress due to the opening pattern is concentrated on an adhesive layer formed on the bottom plate, the adhesive layer may be expelled through the opening pattern or cracks may occur therein. In order to prevent or at least mitigate this, when the adhesive layer is formed only in a non-folding area, an air gap may be formed between a first support substrate and a second support substrate in a folding area. The air gap is an empty space between the first support substrate and the second support substrate that is formed by not having the adhesive layer only in the folding area. Due to the air gap, components of the display panel may be sagged or bent in the non-folding area, which may cause defects in the display device.

In the display device 100 according to an exemplary embodiment of the present disclosure, the second support substrate 140 may be formed to have the plurality of protrusion patterns 141 protruding toward the first support substrate 130. Accordingly, the plurality of protrusion patterns 141 of the second support substrate 140 may be inserted into the plurality of opening patterns 131 of the first support substrate 130. Accordingly, noise may be generated, or degradation of durability may occur due to forming of the plurality of opening patterns 131 in the first support substrate 130.

Specifically, since the plurality of protrusion patterns 141 are disposed within the plurality of opening patterns 131, it is possible to effectively prevent or at least reduce the plurality of opening patterns 141 from being viewed through the display panel 110. Accordingly, noise of the display panel 110 can be reduced and display quality can be improved.

The plurality of protrusion patterns 141 may disperse stress concentrated in the plurality of opening patterns 131. That is, stress generated during folding of the folding area FA is concentrated in an area surrounding the plurality of opening patterns 131 of the first support substrate 130, which may cause deformation of or damage to the first support substrate 130. Also, deformation or damage of the first support substrate 130 may cause defects in the entire display device 100. However, in the display device 100 according to an exemplary embodiment of the present disclosure, stress generated during the folding is not only applied to the area surrounding the plurality of opening patterns 131 of the first support substrate 130 but may also be applied to the plurality of protrusion patterns 141 of the second support substrate 140. Therefore, stress generated during the folding is dispersed, and durability of the display device 100 can be improved.

The plurality of protrusion patterns 141 may prevent or at least reduce sagging of the display panel 110 due to an air gap between the first support substrate 130 and the second support substrate 140. That is, even if an air gap exists in the folding area FA, the plurality of protrusion patterns 141 of the second support substrate 140 may sufficiently support the display panel 110. Accordingly, it is possible to prevent or at least reduce the display panel 110 from being bent in the folding area FA, and to further improve quality of the display device 100.

In the display device 100 according to an exemplary embodiment of the present disclosure, even when the plurality of protrusion patterns 141 are inserted into the plurality of opening patterns 131, degradation of folding characteristics can be prevented or reduced. Specifically, the plurality of protrusion patterns 141 protrude downward toward the first support substrate 130. In this case, a lower portion of the display device 100 may be a portion where tensile stress is generated. That is, the plurality of opening patterns 131 of the first support substrate 130 may be expanded by tensile stress, and the plurality of protrusion patterns 141 of the second support substrate 140 may move in a direction of the tensile stress. Therefore, during a folding operation, the inner surfaces of the plurality of opening patterns 131 and the plurality of protrusion patterns 141 may be easily deformed without friction therebetween.

Figure 7:
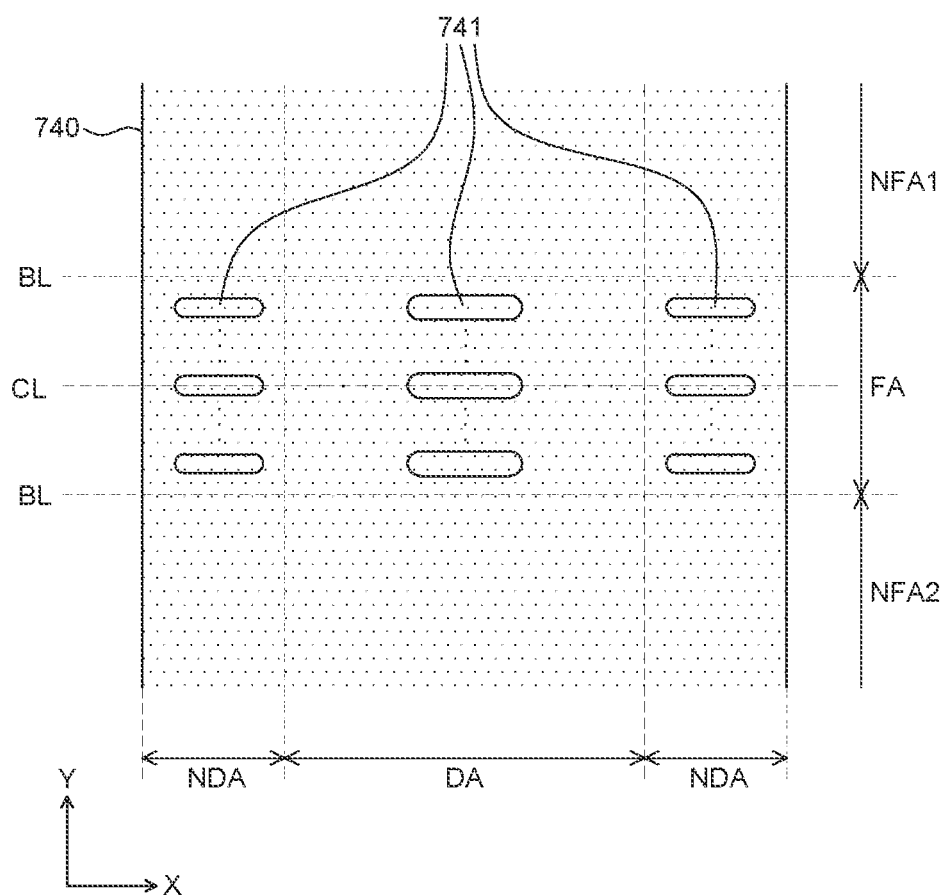
FIG. 7 is an enlarged plan view of a second support substrate according to another exemplary embodiment of the present disclosure.

FIG. 7 is an enlarged plan view of a second support substrate according to another exemplary embodiment of the present disclosure. In FIG. 7, only parts of the folding area FA and the non-folding areas NFA1 and NFA2 adjacent to the folding area FA are illustrated for convenience of explanation. FIG. 7 is a view of a second support substrate 740 when viewed from the bottom.

Referring to FIG. 7, the folding area FA of the second support substrate 740 includes a plurality of protrusion patterns 741. The plurality of protrusion patterns 741 have a shape in which a length in an X-axis direction is greater than a width in a Y-axis direction. Both ends of the plurality of protrusion patterns 741 may be formed to have curvature. Meanwhile, although FIG. 7 schematically illustrates the protrusion patterns 741 disposed in each of the display area DA and the non-display area NDA, the protrusion patterns 741 may substantially have an arrangement structure as illustrated in FIG. 4. In addition, although the protrusion patterns 741 disposed in each of the non-display areas NDA on both sides of the display area DA are illustrated as being disposed in one column in FIG. 7, the protrusion patterns 741 substantially disposed in the non-display area NDA may be disposed in a plurality of columns as illustrated in FIG. 4.

Sizes of the plurality of protrusion patterns 741 may be smaller than sizes of the plurality of opening patterns 131. In this case, the sizes of the plurality of opening patterns 131 may be identical to each other. Also, the plurality of protrusion patterns 741 may have different sizes. Specifically, the plurality of opening patterns 131 have a greater amount of deformation in an outer portion corresponding to the non-display area NDA than in a central portion corresponding to the display area DA, during a folding operation. Thus, by forming the plurality of protrusion patterns 741 with different sizes for the respective areas, degradation of folding characteristics can be prevented or reduced.

The sizes of the protrusion patterns 741 corresponding to the display area DA may be greater than those of the protrusion patterns 741 corresponding to the non-display areas NDA. Here, all of the protrusion patterns 741 corresponding to the display area DA may be formed to have the same size, and all of the protrusion patterns 741 corresponding to the non-display area NDA may be formed to have the same size. Alternatively, the protrusion patterns 741 corresponding to the display area DA may have different sizes, and the protrusion patterns 741 corresponding to the non-display area NDA may have different sizes. For example, the size of the plurality of protrusion patterns 741 may gradually decrease from a central portion of the display area DA to an outer portion of the non-display area NDA. Here, the central portion of the display area DA may mean an area adjacent to a central line of the display area DA that is parallel to the Y-axis direction.

A width of the plurality of protrusion patterns 741 disposed in the folding area FA may be in a range of 85% to 96.5% of the width of the plurality of opening patterns 131. In particular, the width of the protrusion patterns 741 corresponding to the display area DA may be 85% to 96.5% of the width of the opening patterns 131. The width of the protrusion patterns 741 corresponding to the non-display area NDA may be in a range of 85% to 95.5% of the width of the opening patterns 131. That is, the width of the protrusion patterns 741 disposed in the display area DA may be greater than that of the protrusion patterns 741 disposed in the non-display area NDA.

A length of the plurality of protrusion patterns 741 disposed in the folding area FA may be in a range of 90% to 99.9% of the length of the plurality of opening patterns 131. In this case, the length of the protrusion patterns 741 corresponding to the display area DA may be greater than the length of the protrusion patterns 741 corresponding to the non-display area NDA. However, when the folding area FA is folded, the amount of deformation in the length direction of the plurality of opening patterns 131 is very insignificant compared to the amount of deformation in the width direction thereof. Accordingly, in some cases, the protrusion patterns 741 of the display area DA and the non-display areas NDA may have the same length.

In a display device according to another exemplary embodiment of the present disclosure, the plurality of protrusion patterns 741 formed in the folding area FA of the second support substrate 740 may have different sizes. Specifically, since the amount of deformation of the opening patterns 131 is greater in the outer portion than in the central portion during a folding operation, the size of the protrusion patterns 741 disposed in the outer portion may be configured to be smaller than that of the protrusion patterns 741 disposed in the central portion. That is, the size of the protrusion patterns 741 corresponding to the non-display area NDA may be configured to be smaller than the size of the protrusion patterns 741 corresponding to the display area DA. Therefore, even if the amount of deformation of the opening patterns 131 is large in the outer portion, the inner surface of the opening pattern 131 and the protrusion pattern 741 are sufficiently spaced apart from each other, so that friction therebetween can be prevented or reduced. Accordingly, it is possible to prevent or at least reduce degradation of folding characteristics of the display device.

In addition, the amount of deformation of the opening patterns 131 during a folding operation is relatively smaller in the central portion than in the outer portion. Accordingly, the size of the protrusion patterns 741 corresponding to the display area DA may be configured to be greater than that of the protrusion patterns 741 corresponding to the non-display area NDA. Accordingly, generation of noise or degradation of durability in the display area DA can be prevented or at least reduced.

Figure 8:
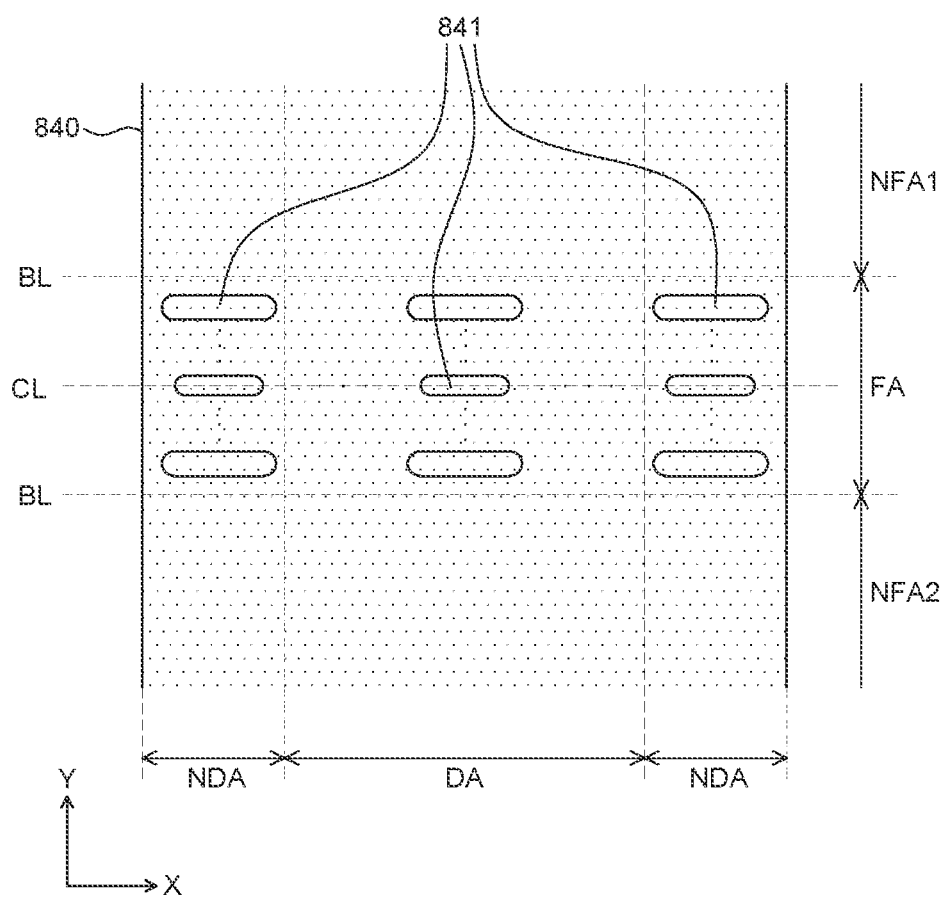
FIG. 8 is an enlarged plan view of a second support substrate according to still another exemplary embodiment of the present disclosure.

FIG. 8 is an enlarged plan view of a second support substrate according to still another exemplary embodiment of the present disclosure. In FIG. 8, only parts of the folding area FA and the non-folding areas NFA1 and NFA2 adjacent to the folding area FA are illustrated for convenience of description. FIG. 8 is a view of a second support substrate 840 when viewed from the bottom.

Referring to FIG. 8, the folding area FA of the second support substrate 840 includes a plurality of protrusion patterns 841. The plurality of protrusion patterns 841 have a shape in which a length in an X-axis direction is greater than a width in a Y-axis direction. Both ends of the plurality of protrusion patterns 841 may be formed to have curvature. Meanwhile, although FIG. 8 schematically illustrates the protrusion patterns 841 disposed in each of the display area DA and the non-display area NDA, the protrusion patterns 841 may substantially have an arrangement structure as illustrated in FIG. 4. In addition, although the protrusion patterns 841 disposed in each of the non-display areas NDA on both sides of the display area DA are illustrated as being disposed in one column in FIG. 8, the protrusion patterns 841 substantially disposed in the non-display area NDA may be disposed in a plurality of columns as illustrated in FIG. 4.

Sizes of the plurality of protrusion patterns 841 may be configured to be smaller than those of the plurality of opening patterns 131. In this case, the sizes of the plurality of opening patterns 131 may be identical to each other. Also, the plurality of protrusion patterns 841 may be configured to have different sizes. Specifically, the plurality of opening patterns 131 have a greater amount of deformation in an area adjacent to a central line CL, which is a folding axis, than in areas adjacent to virtual boundary lines BL between the folding area FA and the non-folding areas NFA1 and NFA2. Accordingly, by forming the plurality of protrusion patterns 841 with different sizes for the respective areas, degradation of folding characteristics can be prevented or at least reduced. Meanwhile, both the central line CL and the virtual boundary lines BL may be lines parallel to the X-axis direction.

The size of the protrusion patterns 841 adjacent to the central line CL may be smaller than the size of the protrusion patterns 841 adjacent to the virtual boundary lines BL. Here, protrusion patterns 841 overlapping the central line CL and some of protrusion patterns 841 adjacent thereto may all have the same size. In addition, protrusion patterns 841 immediately adjacent to the virtual boundary line BL and some of protrusion patterns 841 adjacent thereto may all have the same size. Alternatively, the size of the plurality of protrusion patterns 841 may gradually increase from the central line CL to the virtual boundary lines BL.

A width of the plurality of protrusion patterns 841 disposed in the folding area FA may be in a range of 85% to 96.5% of the width of the plurality of opening patterns 131. In this case, the width of the protrusion patterns 841 adjacent to the virtual boundary line BL may be greater than the width of the protrusion patterns 841 adjacent to the central line CL. A length of the plurality of protrusion patterns 841 disposed in the folding area FA may be in a range of 90% to 99.9% of the length of the plurality of opening patterns 131. In this case, the length of the protrusion patterns 841 adjacent to the virtual boundary line BL may be equal to or greater than the length of the protrusion patterns 841 adjacent to the central line CL.

In a display device according to still another exemplary embodiment of the present disclosure, the plurality of protrusion patterns 841 formed in the folding area FA of the second support substrate 840 may be formed to have different sizes. Specifically, the amount of deformation of the opening patterns 131 during a folding operation is greater in an area adjacent to the central line CL than in areas adjacent to the virtual boundary lines BL. Accordingly, the size of the protrusion patterns 841 adjacent to the central line CL may be configured to be smaller than the size of the protrusion patterns 841 adjacent to the virtual boundary line BL. Therefore, even if the amount of deformation of the opening patterns 131 is large in the area adjacent to the central line CL, the inner surfaces of the opening patterns 131 and the protrusion patterns 841 are sufficiently spaced apart from each other, so friction therebetween can be prevented or reduced. Accordingly, it is possible to prevent or at least reduce degradation of folding characteristics of the display device.

In addition, the amount of deformation of the opening patterns 131 during a folding operation is relatively small in the area adjacent to the virtual boundary line BL than in the area adjacent to the central line CL. Therefore, the size of the protrusion patterns 841 in the area adjacent to the virtual boundary line BL may be greater than the size of the protrusion patterns 841 adjacent to the central line CL. Accordingly, it is possible to prevent or at least reduce generation of noise or degradation of durability in an area adjacent to the virtual boundary line BL of the folding area FA.

Meanwhile, a structure of the plurality of protrusion patterns may be configured as a combination of the exemplary embodiments of FIGS. 7 and 8. For example, in FIG. 7, descriptions are made based on that all the protrusion patterns 741 disposed in the same column have the same size, but they may be configured differently. Specifically, the amount of deformation of the plurality of opening patterns 131 is smaller in the area adjacent to the virtual boundary line BL than in the area adjacent to the central line CL. Accordingly, among the protrusion patterns 741 disposed in the same columns in FIG. 7, the protrusion patterns 741 adjacent to the virtual boundary line BL may be greater than the protrusion patterns 741 adjacent to the central line CL. In addition, in FIG. 8, descriptions are made based on that all the protrusion patterns 841 disposed in the same row have the same size, but they may be configured differently. Specifically, the amount of deformation of the plurality of opening patterns 131 is greater in the non-display area NDA than in the display area DA. Therefore, among the protrusion patterns 841 disposed in the same rows in FIG. 8, the size of the protrusion patterns 841 corresponding to the display area DA may be greater than the size of the protrusion patterns 841 corresponding to the non-display area NDA.

Figure 9:
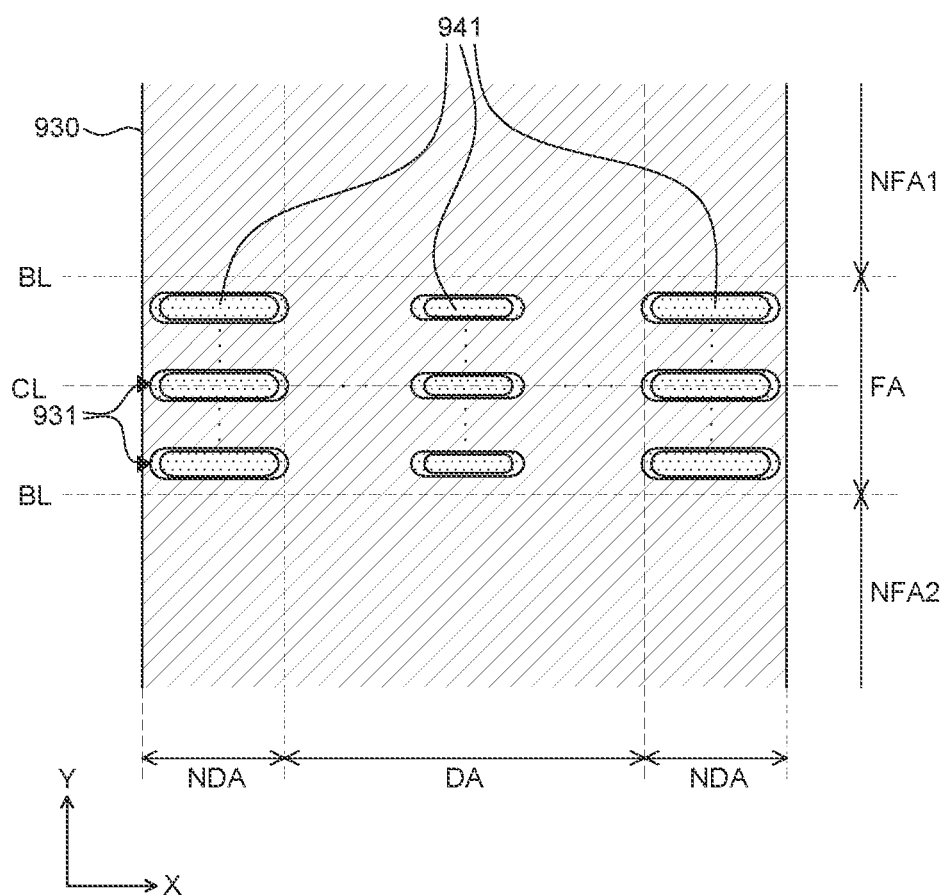
FIG. 9 is an enlarged plan view illustrating coupling of a first support substrate and a second support substrate according to still another exemplary embodiment of the present disclosure.

FIG. 9 is an enlarged plan view illustrating coupling of a first support substrate and a second support substrate according to still another exemplary embodiment of the present disclosure. In FIG. 9, only parts of the folding area FA and the non-folding areas NFA1 and NFA2 adjacent to the folding area FA are illustrated for convenience of description. FIG. 9 is a view of a display device when viewed from a bottom surface of a first support substrate 930.

Referring to FIG. 9, the folding area FA of the first support substrate 930 includes a plurality of opening patterns 931, and the folding area FA of the second support substrate includes a plurality of protrusion patterns 941. When the first support substrate 930 and the second support substrate are coupled, the plurality of protrusion patterns 941 may be inserted into the plurality of opening patterns 931.

The plurality of opening patterns 931 and the plurality of protrusion patterns 941 have shapes in which a length in an X-axis direction is greater than a width in a Y-axis direction. Both ends of the plurality of opening patterns 931 and the plurality of protrusion patterns 941 may be formed to have curvature. Although FIG. 9 schematically illustrates the opening patterns 931 and the protrusion patterns 941 disposed in each of the display area DA and the non-display area NDA, the opening patterns 931 and the protrusion patterns 941 may substantially have an arrangement structure as illustrated in FIG. 5. In addition, although it is illustrated in FIG. 9 that the opening patterns 931 and the protrusion patterns 941 disposed in each of the non-display areas NDA on both sides of the display area DA are disposed in one column, the opening patterns 931 and the protrusion patterns 941 substantially disposed in the non-display area NDA may be disposed in a plurality of columns, as illustrated in FIG. 5.

The plurality of opening patterns 931 may have different sizes. Specifically, the folding area FA of the first support substrate 930 receives greater stress in an outer portion corresponding to the non-display area NDA than in a central portion corresponding to the display area DA, when folded. Accordingly, the stress applied to the folding area FA of the first support substrate 930 may be alleviated by forming the plurality of opening patterns 931 with different sizes for the respective areas.

A size of the opening patterns 931 corresponding to the non-display area NDA may be greater than that of the opening patterns 931 corresponding to the display area DA. Also, the size of the plurality of opening patterns 931 may gradually increase from the display area DA to the non-display area NDA. By forming the size of the opening patterns 931 in the non-display area NDA to be greater than the size of the opening patterns 931 in the display area DA, stress concentration in the outer portion of the non-display area NDA can be alleviated.

Sizes of the plurality of protrusion patterns 941 may be smaller than those of the plurality of opening patterns 931. In this case, the plurality of protrusion patterns 941 may have different sizes. Specifically, a width of the plurality of protrusion patterns 941 disposed in the folding area FA may be in a range of 85% to 96.5% of a width of the plurality of opening patterns 931. Also, a length of the plurality of protrusion patterns 941 disposed in the folding area FA may be in a range of 90% to 99.9% of a length of the plurality of opening patterns 931.

In a display device according to still another exemplary embodiment of the present disclosure, the plurality of opening patterns 931 formed in the folding area FA of the first support substrate 930 may have different sizes. Specifically, stress applied to the opening patterns 931 during a folding operation is greater in the outer portion than in the central portion. Accordingly, the size of the opening patterns 931 disposed in the outer portion may be greater than that of the opening patterns 931 disposed in the central portion. That is, the size of the opening patterns 931 corresponding to the non-display area NDA may be configured to be greater than the size of the opening patterns 931 corresponding to the display area DA. Accordingly, concentration of stress on the opening patterns 931 in the outer portion can be alleviated, and durability of the folding area FA can be improved.

Figure 10:
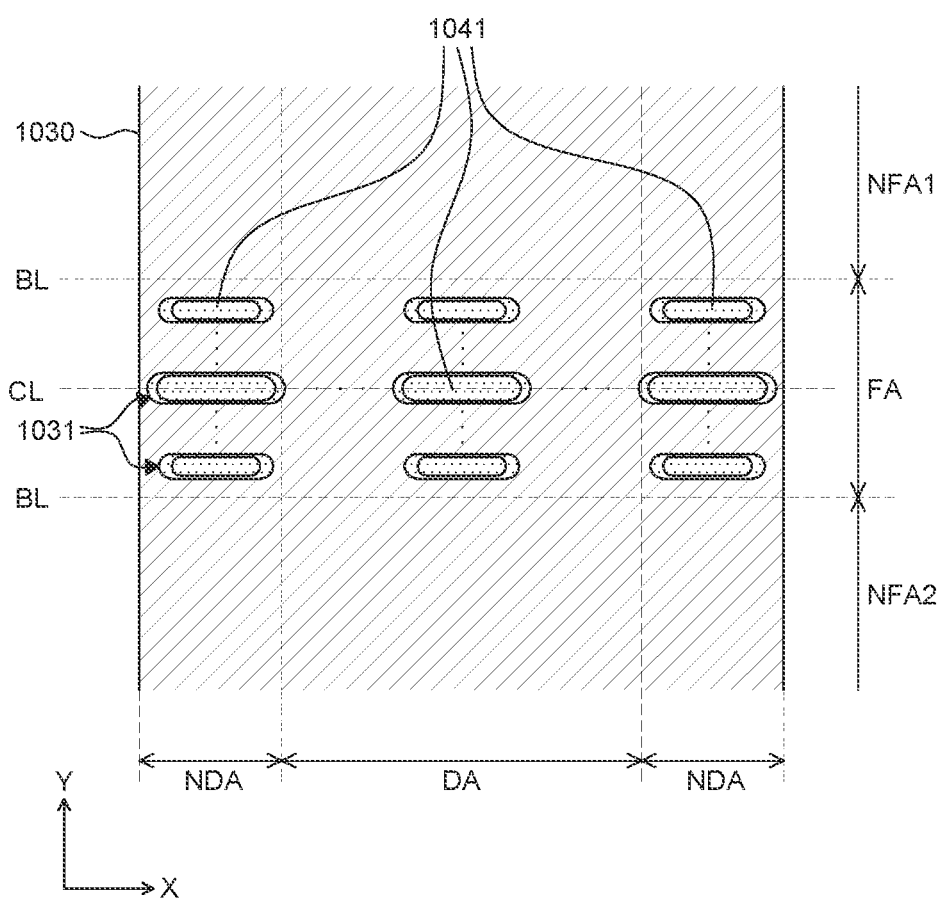
FIG. 10 is an enlarged plan view illustrating coupling of a first support substrate and a second support substrate according to yet another exemplary embodiment of the present disclosure.

FIG. 10 is an enlarged plan view illustrating coupling of a first support substrate and a second support substrate according to yet another exemplary embodiment of the present disclosure. In FIG. 10, only parts of the folding area FA and the non-folding areas NFA1 and NFA2 adjacent to the folding area FA are illustrated for convenience of description. FIG. 10 is a view of a display device when viewed from a bottom surface of a first support substrate 1030.

Referring to FIG. 10, the folding area FA of the first support substrate 1030 includes a plurality of opening patterns 1031, and the folding area FA of the second support substrate includes a plurality of protrusion patterns 1041. When the first support substrate 1030 and the second support substrate are coupled, the plurality of protrusion patterns 1041 may be inserted into the plurality of opening patterns 1031.

The plurality of opening patterns 1031 and the plurality of protrusion patterns 1041 have shapes in which a length in an X-axis direction is greater than a width in a Y-axis direction. Both ends of the plurality of opening patterns 1031 and the plurality of protrusion patterns 1041 may be formed to have curvature. Although FIG. 10 schematically illustrates the opening patterns 1031 and the protrusion patterns 1041 disposed in each of the display area DA and the non-display area NDA, the opening patterns 1031 and the protrusion patterns 1041 may substantially have an arrangement structure as illustrated in FIG. 5. In addition, although FIG. 10 illustrates that the opening patterns 1031 and protrusion patterns 1041 disposed in each of the non-display areas NDA on both sides of the display area DA are disposed in one column, the opening patterns 1031 and the protrusion patterns 1041 substantially disposed in the non-display areas NDA may be disposed in a plurality of columns as illustrated in FIG. 5.

The plurality of opening patterns 1031 may have different sizes. Specifically, the folding area FA of the first support substrate 1030 receives a greater stress in an area adjacent to the virtual boundary line BL than in an area adjacent to the central line CL when folded. Accordingly, stress applied to the folding area FA of the first support substrate 1030 may be alleviated by forming the plurality of opening patterns 1031 with different sizes for the respective areas.

A size of the opening patterns 1031 adjacent to the central line CL may be greater than a size of the opening patterns 1031 adjacent to the virtual boundary line BL. In addition, the sizes of the plurality of opening patterns 1031 may gradually decrease from the central line CL to the virtual boundary line BL. By forming the size of the opening patterns 1031 adjacent to the central line CL to be greater than the size of the opening patterns 1031 adjacent to the virtual boundary line BL, concentration of stress in the area adjacent to the central line CL, which is a folding axis, can be alleviated.

A size of the plurality of protrusion patterns 1041 may be smaller than that of the plurality of opening patterns 1031. In this case, the plurality of protrusion patterns 1041 may have different sizes. Specifically, a width of the plurality of protrusion patterns 1041 disposed in the folding area FA may be in a range of 85% to 96.5% of a width of the plurality of opening patterns 1031. Also, a length of the plurality of protrusion patterns 1041 disposed in the folding area FA may be in a range of 90% to 99.9% of a length of the plurality of opening patterns 1031.

In a display device according to still another exemplary embodiment of the present disclosure, the plurality of opening patterns 1031 formed in the folding area FA of the first support substrate 1030 may have different sizes. Specifically, stress applied to the opening patterns 1031 during a folding operation is greater in the area adjacent to the central line CL than in the area adjacent to the virtual boundary line BL. Accordingly, the size of the opening patterns 1031 adjacent to the central line CL may be configured to be greater than that of the opening patterns 1031 adjacent to the virtual boundary line BL. Accordingly, concentration of stress on the opening patterns 1031 in the area adjacent to the central line CL can be alleviated, and durability of the folding area FA can be improved.

Meanwhile, a structure of the plurality of opening patterns may be configured as combination of the exemplary embodiments of FIGS. 9 and 10. For example, in FIG. 9, descriptions are made based on that the sizes of all of the opening patterns 931 disposed in the same column are the same, but they may be configured differently. Specifically, stress applied to the plurality of opening patterns 931 is greater in the area adjacent to the central line CL than in the area adjacent to the virtual boundary line BL. Therefore, among the opening patterns 931 disposed in the same columns in FIG. 9, the size of the opening patterns 931 adjacent to the central line CL may be configured to be greater than that of the opening patterns 931 adjacent to the virtual boundary line BL. In addition, in FIG. 10, descriptions are made based on that the sizes of all of the opening patterns 1031 disposed in the same row are the same, but they may be configured differently. That is, stress applied to the plurality of opening patterns 1031 is greater in the non-display area NDA than in the display area DA. Therefore, among the opening patterns 1031 disposed in the same rows in FIG. 10, the size of the opening patterns 1031 corresponding to the non-display area NDA may be configured to be greater than the size of the opening patterns 1031 corresponding to the display area DA.

Table 1 is a simulation result showing the amounts of deformation (%) in width according to positions of a plurality of opening patterns. Table 2 is a simulation result showing the amounts of deformation (%) in length according to the positions of the plurality of opening patterns. Here, a first line refers to an area corresponding to a folding axis of a folding area, a third line refers to an area corresponding to a virtual boundary line between the folding area and a non-folding area, and a second line refers to an area corresponding to a central portion between the first line and the third line. Also, a left side means a non-display area on the left side of a display area, a right side means a non-display area on the right side of the display area, and a central portion means the display area.

TABLE 1

|  | Left Side | Central Portion | Right Side |
| --- | --- | --- | --- |
| First Line | 4.279 | 3.068 | 3.743 |
| Second Line | 4.057 | 3.386 | 3.453 |
| Third Line | 0.183 | 0.442 | 0.579 |

TABLE 2

|  | Left Side | Central Portion | Right Side |
| --- | --- | --- | --- |
| First Line | 0.001 | 0.002 | 0.002 |
| Second Line | 0.001 | 0.000 | 0.002 |
| Third Line | 0.001 | 0.000 | 0.001 |

As illustrated in Table 1 and Table 2, the amount of deformation in the left and right sides is greater than the amount of deformation in the central portion. That is, the amount of deformation in the opening patterns in the non-display area of the folding area is greater than the amount of deformation in the opening patterns in the display area of the folding area. This may mean that stress applied to an outer portion of the folding area is greater than stress applied to a central portion of the folding area. Also, the amount of deformation in the third line is smaller than the amount of deformation in the first line. That is, the amount of deformation in the opening pattern adjacent to the folding axis in the folding area is greater than the amount of deformation in the opening pattern adjacent to the virtual boundary line between the folding area and the non-folding area. This may mean that stress applied to an area adjacent to the folding axis is greater than stress applied to an area adjacent to the virtual boundary line.

Therefore, in the display device according to the present disclosure, the size of the protrusion patterns corresponding to an area where the amount of deformation in the opening patterns is large can be formed to be relatively small. Alternatively, the size of the opening patterns corresponding to an area where stress applied to the opening patterns is high may be formed large. Accordingly, even if the protrusion patterns are inserted into the opening patterns, it is possible to prevent or at least reduce degradation of folding characteristics. In addition, durability of the display device can be improved by alleviating concentration of stress in a specific area.

The exemplary embodiments of the present disclosure can also be described as follows:

According to an aspect of the present disclosure, a foldable display device includes a display panel including a folding area and non-folding areas on both sides of the folding area in a folding direction: a first support substrate configured to support the display panel under the display panel and including a plurality of opening patterns corresponding to the folding area: and a second support substrate disposed between the display panel and the first support substrate and including a plurality of protrusion patterns protruding to be inserted into the plurality of opening patterns. Sizes of the plurality of protrusion patterns are smaller than sizes of the plurality of opening patterns.

The plurality of protrusion patterns may protrude toward the first support substrate from the second support substrate.

A width of the plurality of protrusion patterns may be smaller than a width of the plurality of opening patterns, a length of the plurality of protrusion patterns may be smaller than a length of the plurality of opening patterns, and the width may be parallel to the folding direction and the length may be perpendicular to the folding direction.

The width of each of the plurality of protrusion patterns may be smaller than the length of each of the plurality of protrusion patterns; and the width of each of the plurality of opening patterns may be smaller than the length of each of the plurality of opening patterns.

The length of each of the plurality of protrusion patterns may be 90% to 99.9% of the length of each of the plurality of opening patterns.

The width of each of the plurality of protrusion patterns may be 85% to 96.5% of the width of each of the plurality of opening patterns.

The plurality of opening patterns may have the same size, and the plurality of protrusion patterns may have different sizes.

The display panel may include a display area and a non-display area surrounding the display area. Among the plurality of protrusion patterns, the size of the protrusion patterns corresponding to the non-display area may be smaller than the size of the protrusion patterns corresponding to the display area.

The size of the plurality of protrusion patterns may gradually decrease from a central portion of the display area to an outer portion of the non-display area.

Among the plurality of protrusion patterns, the size of the protrusion patterns adjacent to a folding axis may be smaller than the size of the protrusion patterns adjacent to a virtual boundary line between the folding area and the non-folding area.

The size of the plurality of protrusion patterns may gradually decrease from the virtual boundary line toward the folding axis.

The plurality of opening patterns may have different sizes, and the plurality of protrusion patterns may have different sizes.

The display panel may include a display area and a non-display area surrounding the display area. Among the plurality of opening patterns, the size of the opening patterns corresponding to the non-display area may be greater than the size of the opening patterns corresponding to the display area.

Among the plurality of opening patterns, the size of the opening patterns adjacent to a folding axis may be greater than the size of the opening patterns adjacent to a virtual boundary line between the folding area and the non-folding area.

The foldable display device may further include an adhesive layer between the first support substrate and the second support substrate in the non-folding area.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A foldable display device, comprising:
a display panel including a folding area and non-folding areas, the non-folding areas on both sides of the folding area in a folding direction;
a first support substrate configured to support the display panel, the first support substrate under the display panel and including a plurality of opening patterns corresponding to the folding area; and
a second support substrate between the display panel and the first support substrate, the second support substrate including a plurality of protrusion patterns that are inserted into the plurality of opening patterns,
wherein sizes of the plurality of protrusion patterns are smaller than sizes of the plurality of opening patterns, and
wherein among the plurality of protrusion patterns, a size of the plurality of protrusion patterns adjacent to a folding axis is smaller than a size of the plurality of protrusion patterns adjacent to a virtual boundary line between the folding area and the non-folding areas.

2. The foldable display device of claim 1, wherein the plurality of protrusion patterns protrude toward the first support substrate from the second support substrate.

3. The foldable display device of claim 1, wherein a width of the plurality of protrusion patterns is smaller than a width of the plurality of opening patterns,
a length of the plurality of protrusion patterns is smaller than a length of the plurality of opening patterns, and the width is parallel to the folding direction and the length is perpendicular to the folding direction.

4. The foldable display device of claim 3, wherein a width of each of the plurality of protrusion patterns is smaller than a length of each of the plurality of protrusion patterns; and
wherein a width of each of the plurality of opening patterns is smaller than a length of each of the plurality of opening patterns.

5. The foldable display device of claim 3, wherein a length of each of the plurality of protrusion patterns is in a range of 90% to 99.9% of a length of each of the plurality of opening patterns.

6. The foldable display device of claim 3, wherein a width of each of the plurality of protrusion patterns is in a range of 85% to 96.5% of a width of each of the plurality of opening patterns.

7. The foldable display device of claim 1, wherein the plurality of opening patterns have a same size, and
wherein the plurality of protrusion patterns have different sizes.

8. The foldable display device of claim 7, wherein the display panel includes a display area and a non-display area surrounding the display area,
wherein, among the plurality of protrusion patterns, a size of the plurality of protrusion patterns corresponding to the non-display area is smaller than a size of the plurality of protrusion patterns corresponding to the display area.

9. The foldable display device of claim 8, wherein the sizes of the plurality of protrusion patterns gradually decrease from a central portion of the display area to an outer portion of the non-display area.

10. The foldable display device of claim 1, wherein the sizes of the plurality of protrusion patterns gradually decrease from the virtual boundary line toward the folding axis.

11. The foldable display device of claim 1, wherein the plurality of opening patterns have different sizes, and the plurality of protrusion patterns have different sizes.

12. The foldable display device of claim 11, wherein the display panel includes a display area and a non-display area surrounding the display area,
wherein, among the plurality of opening patterns, a size of the plurality of opening patterns corresponding to the non-display area is greater than a size of the plurality of opening patterns corresponding to the display area.

13. The foldable display device of claim 11, wherein, among the plurality of opening patterns, a size of the plurality of opening patterns adjacent to a folding axis is greater than a size of the plurality of opening patterns adjacent to a virtual boundary line between the folding area and the non-folding areas.

14. The foldable display device of claim 1, further comprising:
an adhesive layer between the first support substrate and the second support substrate in the non-folding areas.

15. A foldable display device, comprising:
a display panel including a folding area and non-folding areas, the non-folding areas on both sides of the folding area in a folding direction;
a first support substrate configured to support the display panel, the first support substrate under the display panel and including a plurality of opening patterns corresponding to the folding area; and
a second support substrate between the display panel and the first support substrate, the second support substrate including a plurality of protrusion patterns that are inserted into the plurality of opening patterns,
wherein sizes of the plurality of protrusion patterns are smaller than sizes of the plurality of opening patterns,
wherein the display panel includes a display area and a non-display area surrounding the display area, and
wherein among the plurality of protrusion patterns, a size of the plurality of protrusion patterns corresponding to the non-display area is smaller than a size of the plurality of protrusion patterns corresponding to the display area.

* * * * *